(12) United States Patent
Bardash

(10) Patent No.: US 6,278,117 B1
(45) Date of Patent: Aug. 21, 2001

(54) SOLID STATE RADIATION DETECTOR WITH TISSUE EQUIVALENT RESPONSE

(75) Inventor: Michael J. Bardash, Brooklyn, NY (US)

(73) Assignee: QEL, Inc., Brooklyn, NY (US)

( * ) Notice: Subject to any disclaimer, the term of this patent is extended or adjusted under 35 U.S.C. 154(b) by 0 days.

(21) Appl. No.: 09/358,268

(22) Filed: Jul. 21, 1999

Related U.S. Application Data

(60) Provisional application No. 60/122,729, filed on Mar. 4, 1999.

(51) Int. Cl.⁷ ........................................................ G01T 1/16
(52) U.S. Cl. ............................... 250/370.07; 250/370.05; 250/370.11
(58) Field of Search ........................ 250/370.07, 370.05, 250/370.11, 390.02, 214 R

(56) References Cited

U.S. PATENT DOCUMENTS

| | | | |
|---|---|---|---|
| 4,445,036 | * | 4/1984 | Selph .............................. 250/370.05 |
| 4,641,037 | * | 2/1987 | Butler et al. ..................... 250/390.02 |
| 4,975,222 | * | 12/1990 | Yoshino et al. ...................... 252/586 |
| 5,079,600 | * | 1/1992 | Schnur et al. ............................ 357/4 |
| 5,100,762 | | 3/1992 | Tanaka et al. . |
| 5,117,114 | * | 5/1992 | Street et al. ..................... 250/370.11 |
| 5,523,555 | * | 6/1996 | Friend et al. ..................... 250/214 R |
| 5,596,199 | | 1/1997 | McNulty et al. . |
| 5,691,089 | | 11/1997 | Smayling . |

OTHER PUBLICATIONS

A Protocol for the Determination of Absorbed Dose From High–Energy Photon and Electron Beams, Task Group 21, Radiation Therapy Committee, American Association of Physicists in Medicine, *Medical Physics*, vol. 10, No.6, Nov./Dec.1983, pp. 741–771.

The Quality Factor in Radiation Protection, *International Commission on Radiation Units and Measurements*, Report 40, Apr. 4, 1986 (First Reprinting: Aug. 1993).

Marco Zaider et al., Microdosimetry and Its Application to Biological Processes, *Radiation Dosimetry Physical and Biological Aspects*, Plenum Press, New York, 1986, pp. 171–239.

* cited by examiner

*Primary Examiner*—Constantine Hannaher
*Assistant Examiner*—Otilia Gabor
(74) *Attorney, Agent, or Firm*—Gottlieb, Rackman & Reisman, P.C.

(57) ABSTRACT

A process for making a solid state photoconducting detector from an organic material that has a density very close to that of normal tissue. The resulting detector senses ionizing radiation and has a tissue equivalent response to radiation. The detector's efficiency for any given radiation quality and energy can be measured and the detectors can directly measure dose equivalent. The invention also includes the device itself. The invention encompasses the use of the detector for other purposes such as a solid state photoconducting detector with organic materials unrelated to tissue equivalent properties.

44 Claims, 2 Drawing Sheets

SOLID STATE RADIATION DETECTOR WITH TISSUE EQUIVALENT RESPONSE

This patent claims the benefit of provisional patent application 60/122,729 filed Mar. 4, 1999.

FIELD OF THE INVENTION

This invention relates to radiation dosimetry. More generally, it relates to organic semiconductor devices that are photoconductive detectors of optical and ionizing radiation having the same response to radiation as human tissue, and to their design and fabrication.

BACKGROUND OF THE INVENTION

Currently there are many types of devices for measuring ionizing radiation including ion chambers, proportional counters, diode detectors, photographic film, and thermoluminescent devices.

Ion chambers measure the ionization in a known fixed volume of air by applying a voltage across that known volume and collecting any ion pairs that are created as ionizing radiation passes through the volume. Proportional counters work on a similar principle. Again, a known fixed volume of air or some other substance has a voltage applied across it. Unlike the ion chamber, this applied voltage is sufficiently high so that the ion pairs are substantially accelerated within the fixed volume. These accelerated ions collide with other molecules/atoms and create new ion pairs. The total number of ion pairs that will be collected now will be proportional to the number of ion pairs created by ionizing radiation as it passes through the volume.

Diode detectors are semiconductor diodes, normally made of a group IV semiconductor material. Typically the diode is back biased. Ionizing radiation passing through the depleted region of the diode will cause charge carriers to be generated there. These quickly drift though the depletion region and are collected through the bulk material making up the remainder of the diode.

Photographic film typically has a silver compound that is modified to form a latent image when it is exposed to ionizing or optical radiation. The film can then be developed. The amount of silver compound removed from the film will be a function of the amount of radiation that to which the film was exposed.

Thermoluminescent devices (TLD's) are normally made of a crystalline material. When a TLD is exposed to ionizing is radiation, there is resulting damage to the crystal structure and dislocation cites are created. These dislocations are metastable. When the TLD is heated, the crystal will change state and will radiate low energy photons. These photons are counted using some collection measurement equipment. Typically this would be a photomultiplier tube and the appropriate photon counting electronics. The number of photons counted will be a function of the collection equipment's dark current, its efficiency, and the number of dislocations created in the TLD by the ionizing radiation.

All of the detectors described above provide mechanisms for measuring ionizing radiation dose. Dose is simply the amount of energy deposited per unit mass. A problem is that the absorption cross section for any material is dependent on the radiation energy and the material's physical properties. Before any of the detectors described above are used to measure human exposure (often referred to as dose equivalent) the response of the human tissue over the expected energy range must be characterized. All subsequent measurements of dose must be converted to dose equivalent using a variety of calculation techniques that depend on such factors as the radiation type, ambient pressure and temperature. (See, e.g., Task Group 21 Report by the American Association of Physicists in Medicine or AAPM, and The Quality Factor in Radiation Protection from Report 40 of the International Committee for Radiation Units and Measurement or ICRU) Methods are known for making tissue equivalent radiation detectors ( See, Microdosimetry and its Application to Biological Processes, Plenum Publishing Corp, 1986, Zaider, M. and Rossi, H. H.). These methods employ devices that are usually some sort of ion chamber or proportional counter filled with a gas having the same proportions of carbon, hydrogen, oxygen, and other elements as tissue.

There are many polymers or polymer composite materials that are radiation sensitive (e.g. U.S. Pat. No. 4,975,222 for "Radiation Detecting Elements and Method of Detection", Yoshino et. al.; U.S. Pat. No. 5,100,762 for "Radiation Sensitive Polymer and Radiation Sensitive Composition Containing The Same", Tanaka et. al.). Typically, these materials are used passively (i.e. not quantified in real time) to detect radiation. They may operate by forming fizzures that are subsequently measured or etched away photographically like film. They may be used in the processing and design of integrated circuits (e.g. U.S. Pat. No. 5,691,089 for "Integrated Circuits Formed in Radiation Sensitive Material and Method for Forming Same", Smayling et. al; U.S. Pat. No. 5,596,199 for "Passive Solid State Microdosimeter with Electronic Readout", McNulty et al.). These materials have also been used to produce active optical devices such as light emitting diodes and photodetectors (See U.S. Pat. No. 5,523,555 for "Photodetector Device Having a Semiconductive Conjugated Polymer", Friend et. al).

BRIEF DESCRIPTION OF THE INVENTION

The present invention is a solid state photoconducting detector that senses ionizing radiation. Unlike current radiation detectors, this device is primarily made out of organic material that has a density very close to that of normal tissue. The invention solves the problem of making a semiconductor out of a polymer and measuring the current through the polymer without relying on long range conduction by employing microstructures. Unlike the prior art which had structures of relatively large capacitance the present invention arranges microstructures in a particular geometry that reduces the capacitance and the noise associated with large capacitance. The polymer preferably lies on the top of a double layer which reduces the capacitance of the system. Because the detector's chemical composition is similar to that of tissue, it has a tissue equivalent response to radiation. The detector's efficiency for any given radiation quality and energy can be measured. Once this is done, the detector can directly measure dose equivalence.

The invention provides a tissue equivalent solid state detector comprising a polymeric substrate having on its surface, by deposition or other means, a metallic binder layer. A metallic electrode layer contacts the metallic binder layer. An active polymeric layer is cast onto the polymeric substrate, so that the metallic electrode layer is embedded in the active polymeric layer. The metallic electrode layer has at least two interdigitated conductor lines, each leading to a wire such that there is a small capacitance between the pair of wires. In operation a source of potential is place across the wires and the resistance and/or current across the conductors is measured with an electrometer, bridge or electronic monitoring circuit.

The invention further comprises a method for manufacturing such a detector. The method uses photolithographic techniques on a polymer surface by the steps of printing interdigitated metal patterns on the substrate by a liftoff process, sputtering a binder layer and a metal electrode layer onto the substrate, peeling or lifting off the metal layers to leave the interdigitated patterns of polymer substrate, dicing the substrate so that each interdigitated pattern set becomes one die detector, bonding a die detector into a tissue equivalent case, bonding wires to permit connecting the die's bonding pads to external connections, and applying a polymer as the active region of the device. The polymer is selected from among polythiophene, polyanaline, polyphenylene, and polyphenylene vinylene polymers. Further refinements of this method are discussed in the detailed description of the invention below.

DETAILED DESCRIPTION OF PREFERRED EMBODIMENTS

The invention provides a solid state detector comprising a polymeric substrate having on its surface, by deposition or other means, a metallic binder layer. In its preferred embodiment the detector is tissue equivalent, but the invention, by solving problems heretofore limiting the utility of solid state detectors, includes improvements in solid state detectors in addition to the use of the invention for tissue equivalent detectors. The invention should be understood in this broader sense as well as in the specific utility of the preferred embodiment to be described.

Figure 1:
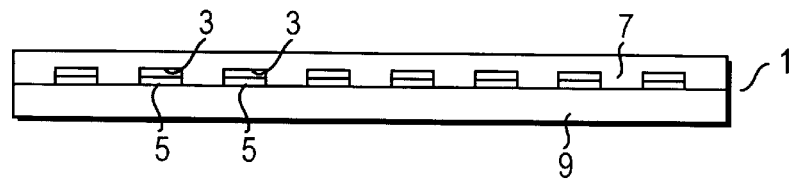
FIG. 1 depicts a cross section of an array of TED devices.
Figure 2:
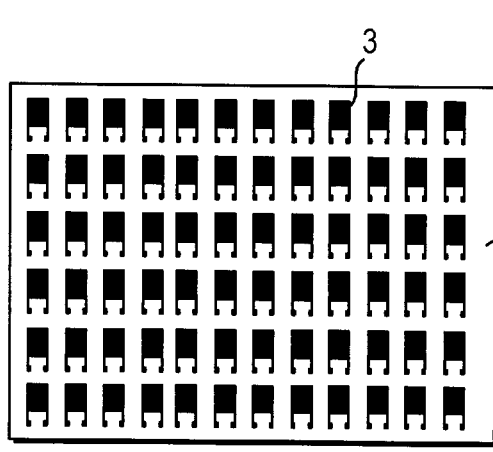
FIG. 2 depicts a top view of an array of TED devices.

In a preferred embodiment, as shown in cross section through an array in FIG. 1, a metallic electrode layer 3 contacts a metallic binder layer 5. An active polymeric layer 7 is cast onto a polymeric substrate 9, so that the metallic electrode layer is embedded in the active polymeric layer 7. A top view of the array is shown in FIG. 2, looking downward through the active polymeric layer. The metallic electrode layer 3 is shown in greater detail in FIG. 3. The layer 3 has at least two arrays interdigitated conductor lines 15 and 17, each leading to one of two respective wire legs 19 and 21, such that there is a small capacitance between the pair of wires. The wires terminate in bonding pads 23 and 25. The separation between the two wires is approximately 2 mm, and the separation between two conductors on either of the interdigitated conductor lines is on the order of $20\mu$. In operation a source of potential 27 is placed across the wires and the resistance across and/or current through the conductors is measured with a meter 29, which may be for example an electrometer, bridge or electronic monitoring circuit. Other electrical measuring apparatus may be substituted.

The distance between legs of the same conductor is between $1\mu$ and $40\mu$, preferably between $1\mu$ and $20\mu$. Preferred values are $20\mu$ and $10\mu$. The capacitance between the wires is preferably less than 5–10 pf, or less than 100 pf. The invention may be practiced with capacitance values less than 1000 pf. The capacitance varies with the dimensions of the conductor.

The active polymeric layer 7 of the tissue equivalent detector should be fashioned from polymeric material having a chemical composition similar to tissue carbohydrates having specific density of about 1. Preferably this is a material consisting essentially of carbon, oxygen, and hydrogen. In general it may contain other elements having a neutron cross section small compared to that of hydrogen.

The tissue equivalent solid state detector, or TED, is constructed by dicing the array shown in FIG. 2 into individual detectors after constructing the array using photolithography techniques on a polymer substrate 9. Typically this substrate would be a 5 mil (0.127 mm) thick sheet of polyimide. Interdigitated metal patterns as shown in FIG. 2 are printed on the substrate using the following "liftoff" process.

Figure 3:
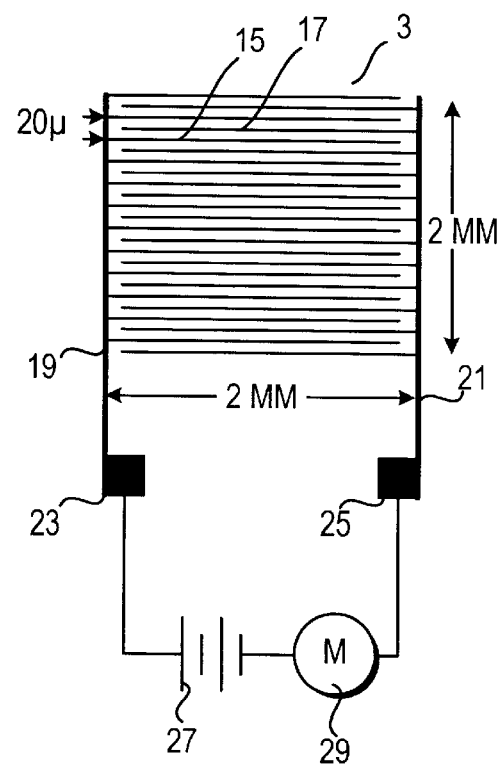
FIG. 3 depicts an enlarged top view of a single TED device metallic electrode/layer.

1. The substrate is ultrasonically cleaned.
2. The substrate is next prepared with a hexamethyl disilafane solution to remove surface water vapor.
3. A layer of photoresist is spun and baked on the substrate.
4. The substrate is then placed in contact with a mask having the desired interdigitated conductor pattern and exposed using an ultraviolet lamp.
5. The substrate is baked in an ammonia atmosphere.
6. The entire substrate is then re-exposed to ultraviolet lamp (without any mask). This, in conjunction with step 6, causes the image to be reversed.
7. The photoresist is then developed. Photoresist that was exposed in step 4 will be etched away.
8. A 100–200 Angstrom binder layer of Nickel or Nickel-Chrome followed by a 2000 Angstrom layer of Gold is either sputtered or evaporated onto the substrate.
9. The substrate is then soaked in acetone. The remaining photoresist and the metal layers on top of it then peel or lift off leaving behind the interdigitated patterns as shown in FIG. 3.

Once the patterns are on the polyimide substrate, the substrate is diced. Each interdigitated pattern set, or die, will become one detector. At this point in the process a detector has been created.

A die can either be bonded into a plastic/tissue equivalent case or a metal case. The former would be for production, and the latter is for convenient testing.

Figure 4:
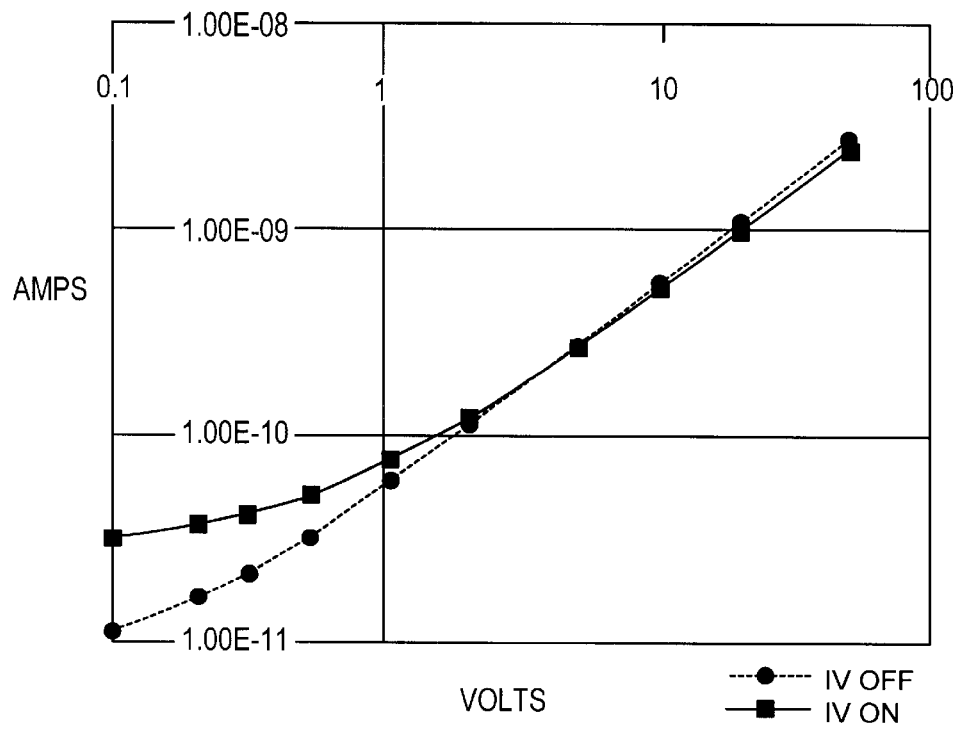
FIG. 4 depicts a Current-Voltage curve for a polythiophene TED device with and without radiation.

Wires are then bonded connecting the die's bonding pads and whatever external connection is required as shown in FIG. 4. The device at this point can be characterized electronically as an open circuited two port device.

The active region of the device now gets applied. There are a number of polymers that can be used for this layer, including but not limited to polythiophene, polyanaline, polyphenylene, and polyphenylene vinylene. For the results presented below, the active region is polythiophene. A layer of thickness between 1 and 5 microns is cast over the entire device.

After the thin film is dry, the device is placed in a plasma deposition chamber. The chamber is evacuated and a mild argon plasma etch cleans the surface of the active polymer layer. Any one of a number of thin inert polymer layers can then be deposited on top of the active layer.

At this point, the device is electronically ready for testing and operation. To make sure the detector indeed functions as a tissue equivalent device, it should be embedded in an inert polymer mixture that has the appropriate "impurities" added to it so that it is the same density and relative chemical composition as tissue. This would normally be a polyurethane based polymer with varying amounts of calcium chloride added to it.

For polymers that have any significant polar moment, the active layer may be enhanced if a voltage is applied across the device while the conducting polymer is being cast. This may cause the polymer molecules to line up in a "preferred" direction and give a more crystalline character to the layer. The result is that the conductivity of the layer will be enhanced.

Polythiophene Results

Figure 5:
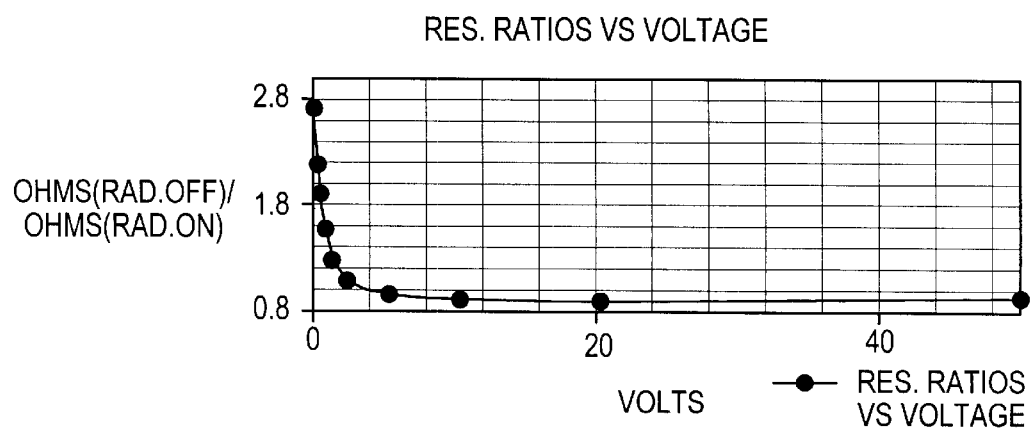
FIG. 5 depicts a curve showing the ratio of the resistance without radiation to the resistance with radiation as a function of voltage for a poly-thiophene device.

Individual poly-thiophene devices were made and tested using a cobalt$^{60}$ gamma source. The dose rate was estimated at approximately 30 centiGray per minute. FIG. 4 shows Current-Voltage curves for the poly-thiophene embodiment in the detector when it is irradiated with photons from a Co$^{60}$ source. The change in values is a result of the radiation induced charge density that contributes/interferes with the carrier dynamics of the polythiophene layer. FIG. 5 shows the ratio of resistance without radiation to the resistance with radiation as a function of voltage for the poly-thiophene devices.

Although particular embodiments of the invention have been described, it will be apparent to persons of ordinary skill in the relevant arts that the invention may be practiced by modifications that do not depart from the substance of the invention. Accordingly the scope of protection of this patent should not be limited to the disclosed embodiments but should be determined from the following description of the invention in terms of claims.

What is claimed is:

1. A tissue equivalent solid state detector comprising
   a polymeric substrate,
   a metallic binder layer deposited on said substrate,
   a metallic electrode layer contacting said metallic binder layer, and comprising
      first and second interdigitated conductor lines, said first conductor lines electrically connected to a first wire leg and said second conductor line electrically connected to a second wire leg, wherein there is a non-zero capacitance between the first and second wire legs,
   an active tissue equivalent polymeric layer cast onto said polymeric substrate, wherein said metallic electrode layer is embedded in said active polymeric layer.

2. The tissue equivalent solid state detector of claim 1, wherein said active polymeric layer is selected from the group consisting of polythiophene, polyanaline, polyphenylene, and polyphenylene vinylene.

3. The tissue equivalent solid state detector of claim 1, wherein the distance between said first and second wire leg is between 1 $\mu$m and 40 $\mu$m.

4. The tissue equivalent solid state detector of claim 1, wherein the distance between said first and second wire leg is approximately 20 $\mu$m.

5. The tissue equivalent solid state detector of claim 1, wherein the distance between said first and second wire leg is between 1 $\mu$m and 20 $\mu$m.

6. The tissue equivalent solid state detector of claim 1, wherein the distance between said first and second wire leg is approximately 10 $\mu$m.

7. The tissue equivalent solid state detector of claim 1, wherein the capacitance between said first and second wire leg is less than 100 $\mu$F.

8. The tissue equivalent solid state detector of claim 1, wherein the capacitance between said first and second wire leg is less than 100 $\mu$F.

9. The tissue equivalent solid state detector of claim 1, wherein the capacitance between said first and second wire leg is less than 5–10 $\mu$F.

10. A solid state detector comprising
    a polymeric substrate,
    a metallic binder layer deposited on said substrate,
    a metallic electrode layer contacting said metallic binder layer, and comprising
       first and second interdigitated conductor lines, said first conductor lines electrically connected to a first wire leg and said second conductor line electrically connected to a second wire leg, wherein there is a non-zero capacitance between the first and second wire legs,
    an active polymeric layer cast onto said polymeric substrate, wherein said metallic electrode layer is embedded in said active polymeric layer.

11. The solid state detector of claim 10, wherein the distance between said first and second wire leg is between 1 $\mu$m and 40 $\mu$m.

12. The solid state detector of claim 10, wherein the distance between said first and second wire leg is approximately 20 $\mu$m.

13. The solid state detector of claim 10, wherein the distance between said first and second wire leg is between 1 $\mu$m and 20 $\mu$m.

14. The solid state detector of claim 10, wherein the distance between said first and second wire leg is approximately 10 $\mu$m.

15. The solid state detector of claim 10, wherein the capacitance between said first and second wire leg is less than 1000 $\mu$F.

16. The solid state detector of claim 10, wherein the capacitance between said first and second wire leg is less than 100 $\mu$F.

17. The solid state detector of claim 10, wherein the capacitance between said first and second wire leg is less than 5–10 $\mu$F.

18. A method for constructing a tissue equivalent solid state detector using photolithography techniques on a polymer substrate comprising
    a. printing interdigitated metal patterns on the substrate by a liftoff process,
    b. sputtering or evaporating onto the substrate a metal binder layer and a metal electrode layer,
    c. peeling or lifting off the metal layers on top of it leaving behind interdigitated patterns of the polymer substrate,
    d. dicing the substrate, wherein each interdigitated pattern set becomes one die detector,
    e. bonding a die detector into a tissue equivalent case,
    f. bonding wires to permit connecting the die's bonding pads to external connections,
    g. applying as the active region of the device a polymer selected from the group consisting of polythiophene, polyanaline, polyphenylene, and polyphenylene vinylene.

19. The method for constructing a tissue equivalent solid state detector of claim 18, wherein said polymer substrate comprises a sheet of polyimide.

20. The method for constructing a tissue equivalent solid state detector of claim 19, wherein said sheet has a thickness of 5 mil (0.127 mm).

21. The method for constructing a tissue equivalent solid state detector of claim 18, wherein the substrate comprises a binder layer of Nickel or Nickel-Chrome followed by a layer of Gold.

22. The method for constructing a tissue equivalent solid state detector of claim 21, wherein said binder layer has a thickness of about 100–200 Angstrom and said layer of Gold has a thickness of about 2000 Angstrom.

23. The method for constructing a tissue equivalent solid state detector of claim 18, wherein said sputtering or evaporating step is followed by the step of cleaning the substrate in acetone.

24. The method for constructing a tissue equivalent solid state detector of claim 18, wherein said step for applying a polymer comprises the steps of
   a. casting a layer of active polymer of thickness between 1 and 5 microns over the entire device,
   b. after the thin film is dry, cleaning the surface of the layer of polymer
   c. depositing a thin inert polymer layer on top of the active layer.

25. The method for constructing a tissue equivalent solid state detector of claim 18, wherein to clean the surface of the active polymer a plasma etch layer is used.

26. The method for constructing a tissue equivalent solid state detector of claim 25, wherein said plasma is a mild argon plasma, and wherein said plasma is used in a plasma deposition chamber.

27. The method for constructing a tissue equivalent solid state detector of claim 18, further comprising the steps of
   a. testing and operating the device by embedding it in an inert polymer mixture that has impurities added to it so that it is the same density and relative chemical composition as tissue,
   b. for polymers that have any significant polar moment, lining up the polymer molecules in a preferred direction, whereby the layer has a more crystalline character and enhanced conductivity.

28. The method for constructing a tissue equivalent solid state detector of claim 27, wherein lining up the polymer molecules is accomplished by applying across the device a voltage while the conducting polymer is being cast.

29. The method for constructing a tissue equivalent solid state detector of claim 27, wherein said inert polymer comprises a polyurethane based polymer and calcium chloride.

30. A method for constructing a tissue equivalent solid state detector using photolithography techniques on a polymer substrate comprising
   a. printing interdigitated metal patterns on the substrate by a liftoff process, said liftoff process comprising
      i. ultrasonically cleaning the substrate,
      ii. removing surface water vapor,
      iii. depositing a layer of photoresist onto the substrate,
      iv. placing the substrate in contact with a mask and exposing the substrate to radiation from an ultraviolet lamp to form a latent image,
      v. baking the substrate,
      vi. re-exposing the substrate to ultraviolet lamp (without said mask) to cause the latent image to be reversed,
      vii. developing the photoresist such that the exposed photoresist will be etched away,
   b. sputtering or evaporating onto the substrate a binder layer,
   c. peeling or lifting off the remaining photoresist and the metal layers on top of it leaving behind interdigitated patterns,
   d. dicing the substrate, wherein each interdigitated pattern set becomes one die detector,
   e. bonding a die into a tissue equivalent case,
   f. bonding wires to permit connecting the die's bonding pads to external connections,
   g. applying as the active region of the device a polymer selected from the group consisting of polythiophene, polyanaline, polyphenylene, and polyphenylene vinylene.

31. The method for constructing a tissue equivalent solid state detector of claim 30, wherein the step of removing surface water vapor comprises preparing the substrate with a hexamethyl disilafane solution and the step of baking the substrate takes place in an ammonia atmosphere.

32. The method for constructing a tissue equivalent solid state detector of claim 30, wherein said polymer substrate comprises a 5 mil (0.127 mm) thick sheet of polyimide.

33. The method for constructing a tissue equivalent solid state detector of claim 30, wherein the substrate comprises a 100–200 Angstrom binder layer of Nickel or Nickel-Chrome followed by a 2000 Angstrom layer of Gold.

34. The method for constructing a tissue equivalent solid state detector of claim 30, wherein said sputtering or evaporating step is followed by the step of soaking the substrate in acetone.

35. The method for constructing a tissue equivalent solid state detector of claim 30, wherein said step for applying a polymer comprises the steps of
   a. casting a layer of thickness between 1 and 5 microns over the entire device,
   b. after the thin film is dry, cleaning the surface of the active polymer
   c. depositing a thin inert polymer layer on top of the active layer.

36. The method for constructing a tissue equivalent solid state detector of claim 30, wherein to clean the surface of the active polymer a mild argon plasma etch layer is used in a plasma deposition chamber.

37. The method for constructing a tissue equivalent solid state detector of claim 30, further comprising the steps of
   a. testing and operating the device by embedded it in an inert polymer mixture that has the appropriate impurities added to it so that it is the same density and relative chemical composition as tissue,
   b. for polymers that have any significant polar moment, lining up the polymer molecules in a preferred direction, whereby the layer has a more crystalline character and enhanced conductivity.

38. The method for constructing a tissue equivalent solid state detector of claim 37, wherein lining up the polymer molecules is accomplished by applying across the device a voltage while the conducting polymer is being cast.

39. The method for constructing a tissue equivalent solid state detector of claim 37, wherein said inert polymer comprises a polyurethane based polymer with varying amounts of calcium chloride added to it.

40. A method for constructing a tissue equivalent solid state detector using photolithography techniques on a 5 mil (0.127 mm) thick sheet of polyimide polymer substrate comprising
   a. printing interdigitated metal patterns on the substrate by a liftoff process, said liftoff process comprising
      i. ultrasonically cleaning the substrate,
      ii. preparing the substrate with a hexamethyl disilafane solution to remove surface water vapor,
      iii. spinning and baking a layer of photoresist onto the substrate,
      iv. placing the substrate in contact with a mask and exposing the substrate to radiation from an ultraviolet lamp to form a latent image, v. baking the substrate in an ammonia atmosphere,
vi. re-exposing the substrate to ultraviolet lamp (without said mask) to cause the latent image to be reversed,
vii. developing the photoresist such that the photoresist that was exposed in step iv will be etched away.
b. sputtering or evaporating onto the substrate a 100–200 Angstrom binder layer of Nickel or Nickel-Chrome followed by a 2000 Angstrom layer of Gold,
c. soaking the substrate in acetone,
d. peeling or lifting off the remaining photoresist and the metal layers on top of it leaving behind interdigitated patterns,
e. dicing the substrate, wherein each interdigitated pattern set becomes one die detector,
f. bonding a die into a tissue equivalent case,
g. bonding wires to permit connecting the die's bonding pads to external connections,
h. applying as the active region of the device a polymer selected from the group consisting of polythiophene, polyanaline, polyphenylene, and polyphenylene vinylene by the steps of
  i. casting a layer of thickness between 1 and 5 microns over the entire device,
  ii. after the thin film is dry, cleaning the surface of the active polymer by using a mild argon plasma etch layer in a plasma deposition chamber,
  iii. depositing a thin inert polymer layer on top of the active layer.

41. The method for constructing a tissue equivalent solid state detector of claim 40, further comprising the steps of a. testing and operating the device by embedded it in an inert polymer mixture that has the appropriate impurities added to it so that it is the same density and relative chemical composition as tissue,
b. for polymers that have any significant polar moment, lining up the polymer molecules in a preferred direction, whereby the layer has a more crystalline character and enhanced conductivity.

42. The method for constructing a tissue equivalent solid state detector of claim 40, wherein lining up the polymer molecules is accomplished by applying across the device a voltage while the conducting polymer is being cast.

43. The method for constructing a tissue equivalent solid state detector of claim 40, wherein said inert polymer comprises a polyurethane based polymer with varying amounts of calcium chloride added to it.

44. The method for constructing a tissue equivalent solid state detector of claim 40, further comprising the steps of a. testing and operating the device by embedded it in an inert polymer mixture comprising a polyurethane based polymer with varying amounts of calcium chloride added to it, and the same density and relative chemical composition as tissue,
b. for polymers that have any significant polar moment, lining up the polymer molecules in a preferred direction by applying across the device a voltage while the conducting polymer is being cast, whereby the layer has a more crystalline character and enhanced conductivity.

* * * * *